(12) United States Patent
Horn

(10) Patent No.: US 7,448,797 B2
(45) Date of Patent: Nov. 11, 2008

(54) COMPONENT ARRANGEMENT AND METHOD FOR DETERMINING THE TEMPERATURE IN A SEMICONDUCTOR COMPONENT

(75) Inventor: Wolfgang Horn, Klagenfurt (AT)

(73) Assignee: Infineon Technologies AG, Munich (DE)

( * ) Notice: Subject to any disclaimer, the term of this patent is extended or adjusted under 35 U.S.C. 154(b) by 93 days.

(21) Appl. No.: 11/655,749

(22) Filed: Jan. 19, 2007

(65) Prior Publication Data

US 2007/0200193 A1 Aug. 30, 2007

(30) Foreign Application Priority Data

Jan. 20, 2006 (DE) .................. 10 2006 002 904

(51) Int. Cl.
*G01K 7/00* (2006.01)
(52) U.S. Cl. .................. 374/173; 374/163; 327/512
(58) Field of Classification Search ............. 374/173, 374/163
See application file for complete search history.

(56) References Cited

U.S. PATENT DOCUMENTS 4,413,917 A * 11/1983 Cooper ................ 374/173
4,475,823 A * 10/1984 Stone ...................... 374/1
7,322,743 B2 * 1/2008 Gozloo et al. ............ 374/170
2008/0082291 A1 * 4/2008 Jeong et al. .............. 702/136

FOREIGN PATENT DOCUMENTS

EP 1 285 841 A1 2/2003

* cited by examiner

*Primary Examiner*—Edward Lefkowitz
*Assistant Examiner*—Mirellys Jagan
(74) *Attorney, Agent, or Firm*—Maginot, Moore & Beck

(57) ABSTRACT

A component arrangement is disclosed herein comprising
a temperature sensor integrated in a semiconductor body, said temperature sensor being designed to generate a first temperature signal dependent on a temperature in the semiconductor body;
a control device comprising a control amplifier, which has a first and a second input and an output, and comprising a low-pass filter having an input and an output, the input of the low-pass filter being coupled to the output of the control amplifier, the first input of the control amplifier being coupled to the temperature sensor and the second input of the control amplifier being coupled to the output of the low-pass filter; and
an output, which is coupled to the output of the control amplifier and at which a second temperature signal is available.

A method for determining the temperature in a semiconductor component is also disclosed herein.

17 Claims, 2 Drawing Sheets

COMPONENT ARRANGEMENT AND METHOD FOR DETERMINING THE TEMPERATURE IN A SEMICONDUCTOR COMPONENT

CROSS-REFERENCE TO RELATED APPLICATIONS

This application claims priority from German patent application number 10 2006 002 904.6, filed Jan. 20, 2006.

TECHNICAL BACKGROUND

The present invention relates to a component arrangement comprising a semiconductor component and a temperature measuring arrangement, and to a method for determining the temperature in a semiconductor component, in particular for determining the temperature at a point that is hottest during the operation of the component, the so-called "hot spot" temperature.

During operation of semiconductor components, the power loss that is inevitably incurred leads to the heating of the semiconductor component. Said heating is all the greater, the more power is converted in the semi-conductor component. This evolution of heat is critical particularly in the case of power components, such as power transistors, for example, which are designed to switch voltages of up to a few hundred volts in conjunction with currents of corresponding magnitude. Such power transistors are used for example for driving loads in output stages and switching stages for industrial electronics and automotive engineering.

The temperature of a semiconductor component, in particular of a power semiconductor component, constitutes a significant parameter to be monitored during operation. An excessively high temperature of the component, which is caused for example by an increased ambient temperature, by a malfunction of the semiconductor component or by a malfunction of a connected load, may lead to damage or destruction of the component and furthermore also to the impairment or even destruction of the load. The maximum permissible depletion layer temperature of silicon-based transistors is for example approximately 175° C. to 200° C., and that of germanium-based transistors is approximately 75° C. to 90° C. An overshooting of this temperature range leads to the destruction of the respective semiconductor component. It is therefore essential to identify a possible overtemperature of semiconductor components in good time and reliably in order to be able to implement suitable measures, such as, for example, turning off the semiconductor component or the load, before critical temperature values are reached, and thus before a damaging event occurs.

In this connection, it may be desirable not only to reliably identify the overtemperature of a semiconductor component, but also to be able to detect the respectively current temperature value of the component in real time. This enables an analysis of the temperature behavior of a circuit, for example in a manner dependent on different operating states.

In order to determine the temperature of a semi-conductor component, it is known to fit a temperature sensor on the housing of the semiconductor component or on the semiconductor body/chip itself arranged in the housing. In this case, the sensor and the actual semi-conductor component are two separate components, so that the sensor only detects the temperature externally at the semiconductor component. This external temperature may deviate considerably from the temperature within the semiconductor component, particularly when the position of the temperature sensor is far away from the position of the hottest point in the semiconductor body. What is more, temperature changes within the semiconductor body affect temperature changes in the region of the sensor only in a time-delayed fashion. However, precisely the exact detection of the temperature within the semiconductor body is relevant for determining critical operating states or the analysis of dynamic operations.

In order to determine the internal temperature of a semiconductor component, it is furthermore known to provide a temperature sensor in the same semiconductor body into which the semiconductor component is integrated. Said sensor is a diode, for example, which is operated in the reverse direction and the reverse current or reverse voltage of which is detected.

What is common to the known arrangements or methods for temperature measurement is that even in the case of integrated temperature sensors, the measured temperature is always lower than the actual peak temperature at the hottest location—also referred to as "hot spot"—of the semiconductor component. An essential reason for this is that the temperature sensor cannot be positioned directly at the position of the hot spot itself, for example at the depletion layer of a power transistor, without impairing the desired function of the semiconductor component itself. The sensor is therefore arranged at a distance from the hot spot.

Furthermore, the measurement of the temperature of a semiconductor component by means of a concomitantly integrated temperature sensor always has a temporal inertia. Particularly in the case of fast transient changes in the temperature at the hot spot of a semi-conductor component, such as occur for example when a load is turned on by means of a power transistor, a change in the temperature at the hot spot affects a temperature sensor spatially remote from said hot spot only in temporally delayed fashion. Due to a thermal capacity of the semiconductor body that is inevitably present, the thermal transfer path for the temperature between the hot spot and the temperature sensor acts like a low-pass filter. Therefore, it may, if applicable, not be possible to react rapidly enough to a rapidly occurring overtemperature of the semi-conductor component, such as by turning off or regulating back a load, for example.

SUMMARY

A component arrangement in accordance with one exemplary embodiment of the invention comprises a semi-conductor component having a semiconductor body, and a temperature measuring arrangement for determining a temperature at a specific position in the semiconductor body. In this case, the temperature measuring arrangement comprises a temperature sensor integrated in the semiconductor body, said temperature sensor being designed to generate a first temperature signal dependent on a temperature in the semiconductor body and a control device. The control device comprises a control amplifier, which has a first and a second input and an output, and a low-pass filter having an input and an output. In this case, the input of the low-pass filter is coupled to the output of the control amplifier, the first input of the control amplifier is coupled to the temperature sensor and the second input of the control amplifier is coupled to the output of the low-pass filter. In the case of this temperature measuring arrangement, the control signal forms a signal dependent on the temperature at the specific position of the semiconductor body, a temperature output signal dependent on said control signal being available at the temperature measuring arrangement.

The semiconductor component has a thermal transfer path between the predefined position in the semiconductor body and the position of the temperature sensor with a thermal transfer function having a low-pass filter behavior. In this case, the low-pass filter behavior of the low-pass filter of the control device is adapted to the low-pass filter behavior of the thermal transfer path and has a low-pass filter behavior corresponding to the thermal transfer function.

Of the thermal transfer path, only the temperature at the end of the transfer path, namely the temperature in the semiconductor body at the position of the temperature sensor, is known by means of the first temperature signal. In the arrangement, the control amplifier sets the input signal of the low-pass filter in such a way that the output signal of said filter corresponds to the first temperature signal. The input signal of said filter then represents directly and in real time a measure of the temperature at the specific position in the semiconductor body.

In one exemplary embodiment of the method according to the invention for determining the temperature at a predefined position in a semiconductor body, the following method steps are provided:

- determination of the temperature at a position at a distance from the specific position and provision of a temperature signal dependent on said temperature,
- determination of a thermal transfer function between the specific position and the position of temperature determination,
- provision of a filter for an electrical input signal, which has a transfer function corresponding to the thermal transfer function,
- feeding of a control signal into the filter, which is dependent on a comparison of the temperature signal with an output signal of the filter, and provision of said control signal or of a signal dependent on said control signal as a temperature signal dependent on the temperature at the specific position.

The low-pass filter may be realized in particular digitally as an FIR filter (FIR=Finite Impulse Response) or as an IIR filter (IIR=Infinite Impulse Response), which, in comparison with the configuration as a discrete or integrated circuit, permits a simulation of the electrical equivalent circuit diagram of the thermal transfer path with lower complexity and greater flexibility in the optimization of the filter parameters.

BRIEF DESCRIPTION OF THE FIGURES

Exemplary embodiments of the invention are explained in more detail below with reference to figures.

DETAILED DESCRIPTION OF THE FIGURES

In the figures, unless specified otherwise, identical reference symbols designate identical parts with the same meaning.

Figure 1:
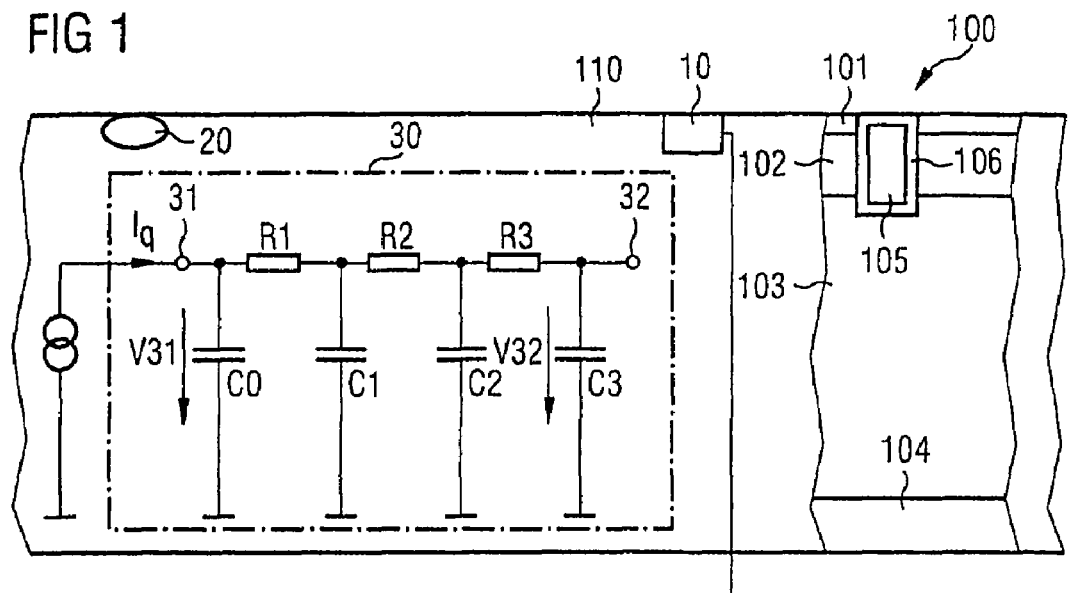
FIG. 1 shows a cross section through a semiconductor body of a semiconductor component with a temperature sensor and an electrical equivalent circuit diagram of a thermal transfer path between a specific position in the semiconductor body and the position of the temperature sensor.

FIG. 1 schematically shows a cross section through a semiconductor body 100 of a semiconductor component, in particular of a power component, such as a power transistor, for example. In order to afford a better understanding, but without restricting the invention to power transistors, a component structure of a vertical power transistor is illustrated partially in the right-hand part of the figure. Said structure comprises a source zone 101, a body zone 102, a drift zone 103 and a drain zone 104, and also a gate electrode 105 arranged adjacent to the body zone 102, said gate electrode being insulated from the body zone 102 by an insulation layer 106 and serving to control an accumulation channel in the body zone 102 between the source zone 101 and the drift zone 103. The cellular component structure illustrated can be repeated regularly and, in a manner that is not specifically illustrated, occupy a large part of the space available in the semiconductor body.

In FIG. 1, the reference symbol 20 designates a position in the semiconductor body 100 at which the temperature of the semiconductor body is to be determined. In order to simplify the further explanations, in the example illustrated, said position is situated near a surface of the semiconductor body 100, but may be arranged arbitrarily in the semi-conductor body 100. The position 20 is, in particular, the position at which the highest temperatures occur in the semiconductor body. Without restricting the general validity of the invention, said position 20 is referred to hereinafter as the "hot spot" position and the temperature at said position 20 is referred to hereinafter as the hot spot temperature.

A temperature sensor 10 is arranged in the semi-conductor body 100 at a distance from the hot spot position 20, said temperature sensor being designed to generate a temperature signal V10 dependent on a temperature at the position of the semiconductor body 100 at which the temperature sensor 10 is arranged.

The temperature sensor 10 may be a customary temperature sensor 10 and comprise for example a reverse-biased pn diode. In this case, the temperature signal V10 is exponentially dependent on the temperature at the sensor 10.

The temperature at the sensor 10 usually differs from the hot spot temperature due to the distance between the hot spot position 20 and the position of the temperature sensor and an inevitably present thermal capacity of a semiconductor region 110 between these positions. What is serious, moreover, is that changes in the hot spot temperature lead to temperature changes at the sensor 10 only in time-delayed fashion.

A "thermal transfer path" between the hot spot position 20 and the sensor position thus has a low-pass filter behavior. T20(t) hereinafter designates the hot spot temperature, which is dependent on the time t, and T10(t) hereinafter designates the temperature at the sensor 10, which is likewise dependent on the time t. A transfer function $H_T(s)$ of the thermal transfer path between the hot spot position and the sensor position can be represented using the Laplace transforms T20(s) and T10(s) of the hot spot temperature T20(t) and the sensor temperature T10(t) as follows:

$$H_T(s) = \frac{T10(s)}{T20(s)} \quad (1)$$

The transfer response of such a thermal transfer path having the transfer function $H_T(s)$ can be simulated by an N-th order electrical low-pass filter 30, which is likewise illustrated in FIG. 1. Said low-pass filter has an input 31 for feeding in an input signal V31 and an output 32 for providing an output signal V32.

The filter order and the filter parameters can be determined by simulations using the method of finite elements. These methods are sufficiently known, with the result that further explanations can be dispensed with in this respect.

In this case, the order N of the filter depends in particular on the length of the thermal conduction path between hot spot 20 and temperature sensor 10 and maps the inertia and attenuation of the transfer of the temperature on the path between the hot spot 20 of the semiconductor component and the spatially remote temperature sensor 10. Said filter 30 is chosen such that its transfer response corresponds to the transfer response of the thermal transfer path, that is to say that the following holds true:

$$H30(s) = \frac{V32(s)}{V31(s)} = H_T(s) \quad (2)$$

In this case, V31(s), V32(s) designate the Laplace transforms of the filter input and output signals.

The equivalent circuit diagram illustrated in FIG. 1 for the thermal transfer in the semiconductor body 100 between the hot spot 20 and the sensor position comprises, alongside the low-pass filter 30, a current source Q, which represents a heat source relative to the thermal transfer path and which generates a current Iq representing a thermal power output provided by the heat source or a power loss incurred in the component in the region of the hot spot 20.

In the example, the low-pass filter has an input capacitor C0 and a number of RC elements each having a resistor R1, R2, R3 and a capacitor, said RC elements being connected in cascade with the input capacitor C0. The low-pass filter 30 illustrated is a third-order filter, that is to say has three RC elements, in which case the filter order, in the manner already explained, can be varied as desired depending on the properties of the thermal transfer path to be simulated.

A voltage across the input capacitor C0 that is brought about by the current Iq corresponds to the input signal V31 of the filter 30. This input voltage V31 of the filter represents the hot spot temperature T20(t) of the semiconductor body. The output signal V32 of the filter 30 corresponds to the voltage across the capacitor C3 of the last RC element of the cascade. This output voltage V32 of the filter represents the temperature T10 at the temperature sensor.

Voltages which are present across the capacitors C1, C2 of the further RC elements in the filter 30 in each case represent temperatures at positions of the semi-conductor body 100 in the region 110 between the hot spot position 20 and the sensor position. Each of the RC elements of the filter represents a semiconductor section or the temperature transfer response of such a semiconductor section between the hot spot position and the sensor position.

In accordance with the analogy between the thermal transfer response of the path between hot spot 20 and spatially remote temperature sensor 10 in the semi-conductor component and the electrical equivalent circuit diagram, the power loss converted into heat and determining the temperature of the hot spot 20 corresponds to the current Iq. The capacitors C0, C1, C2, C3 correspond to the thermal capacities of the semiconductor component at the respective location of the thermal transfer path on the way from the hot spot 20 to the temperature sensor 10 and the resistors R1, R2, R3 correspond to the thermal resistances of the semiconductor component at the respective location of the thermal transfer path on the way from the hot spot to the temperature sensor TS.

Figure 2:
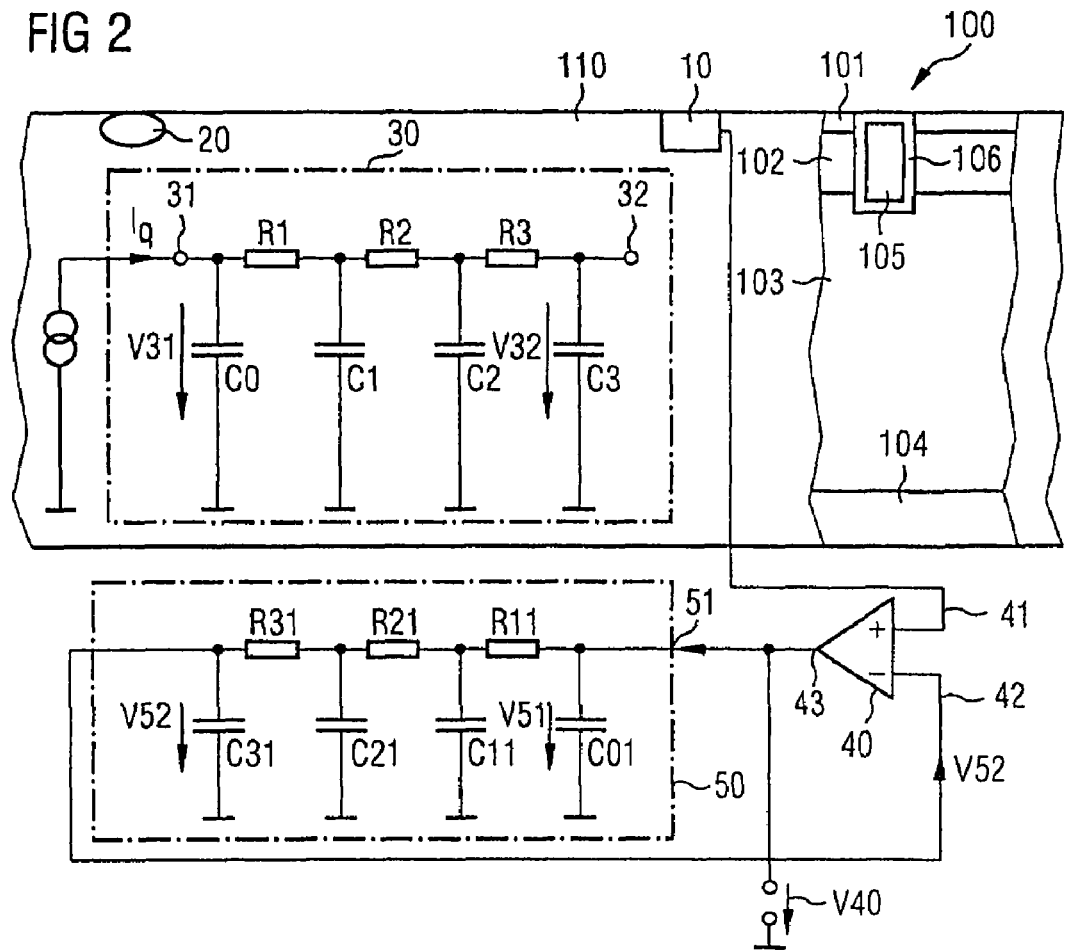
FIG. 2 shows a first exemplary embodiment of a component arrangement according to the invention having a semiconductor component with a semiconductor body and a temperature measuring arrangement with a temperature sensor and a control arrangement with a low-pass filter.

FIG. 2 shows an exemplary embodiment of a component arrangement according to the invention which has a temperature measuring arrangement designed to determine the hot spot temperature accurately and in real time.

In addition to the temperature sensor 10 already explained above, the temperature measuring arrangement has a control arrangement comprising a control amplifier 40 and a low-pass filter 50. The low-pass filter 50 has an input 51 for feeding in an input signal V51 and an output for providing an output signal V52 and is embodied in such a way that the electrical transfer response thereof corresponds to the thermal transfer response of the thermal transfer path between the hot spot 20 and the temperature sensor 10. The following therefore holds true:

$$H50(s) = \frac{V52(s)}{V51(s)} = k \cdot H_T(s) \quad (3)$$

In this case, V52(s), V51(s) designate the Laplace transforms of the input and output signals of the low-pass filter 50. k designates a constant factor by which the transfer functions may differ.

The transfer response of the low-pass filter 50 thus corresponds to the transfer response of the above-explained low-pass filter 30 of the electrical equivalent circuit diagram of the thermal transfer path. The low-pass filter 50 of the control arrangement can thus be realized in a manner corresponding to the low-pass filter of the electrical equivalent circuit diagram as an Nth-order RC filter comprising an input capacitor C01 and a plurality of RC elements each having a resistor R11, R21, R31 and a capacitor C11, C21, C31, said RC elements being connected in cascade with the input capacitor C01. In this case, the input voltage V51 fed to the low-pass filter 50 corresponds to the voltage across the input capacitor C01, and the output voltage V52 of the low-pass filter 50 corresponds to the voltage across the capacitor C31 of the last RC element of the cascade.

The control amplifier 40 is formed for example as an operational amplifier and has a first and second input 41, 42 and an output 40, at which an output voltage V40 is available. The output of the control amplifier 40 is coupled to the input of the low-pass filter 50, and the sensor signal V10 dependent on the temperature T10 at the sensor is fed to the first input 41 of the control amplifier 40. The control arrangement additionally has a feedback loop via which the output voltage V52 of the low-pass filter is fed back to the second input 42 of the control amplifier.

In the case of this arrangement, the control amplifier 40 generates the input signal V51 of the low-pass filter 50 in such a way that the output signal V51 of the low-pass filter 50 corresponds to the sensor signal V10. Since the transfer response of the low-pass filter 50 for the electrical input signal V51 or the amplifier output signal V40 is adapted to the thermal transfer response of the thermal transfer path between the hot spot 20 and the sensor, the signal V40 present at the output of the control amplifier directly represents a measure of temperature T20 at the hot spot. In this case, the dependence of the amplifier output signal V40 on the hot spot temperature T20 corresponds to the dependence of the sensor signal V10 on the temperature T10 at the sensor 10. Said dependence between the sensor signal V10 and the sensor temperature T10 can be represented as follows:

$$V10 = f(T10) \tag{4a}$$

In this case, f(.) designates a function dependent on the type of sensor used. The following correspondingly holds true for the amplifier output signal V40:

$$V40 = f(T20) \tag{4b}$$

The signal V40 that can be tapped off at the output of the control amplifier 40 thus corresponds to a temperature signal which would be obtained given direct positioning of the sensor 10 at the hot spot 20. The control device with the low-pass filter simulating the thermal transfer path thus enables detection of the hot spot temperature T20 in real time, that is to say in a manner free of delay, but without having to arrange the sensor at the hot spot position 20, which in many cases could not be technically realized anyway.

The temperature measuring arrangement comprising the sensor 10 and the control arrangement 40, 50 can be monolithically integrated in the semiconductor body 100. Furthermore, there is the possibility of integrating the control arrangement outside the semi-conductor body, for example in a separate semiconductor body that is arranged on or alongside the semiconductor body 100 using chip-on-chip technology or using chip-by-chip technology (not illustrated).

The time constants of the thermal transfer path are comparatively large owing to the comparatively slow temperature propagation in the semiconductor body 100, with the result that correspondingly large time constants are to be provided for the low-pass filter. However, the realization of large time constants presupposes the use of large capacitances and resistances, which can only be realized in a costly manner in respect of space outlay.

Figure 3:
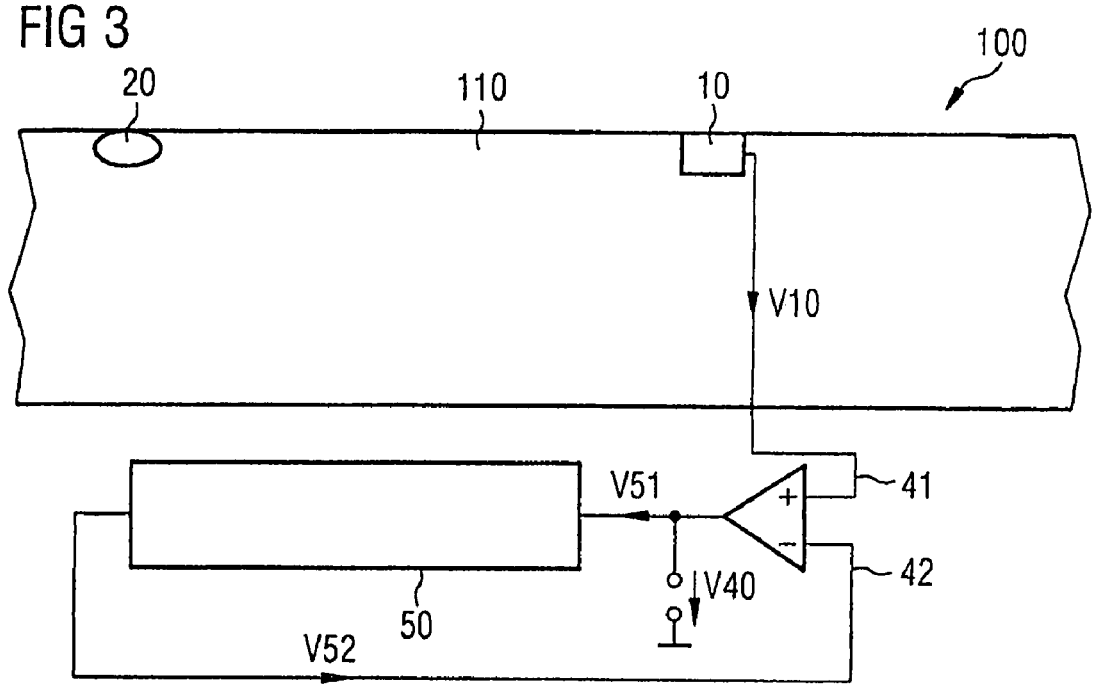
FIG. 3 shows an exemplary embodiment of the component arrangement according to the invention in which the low-pass filter is realized as a digital filter.

In order to avoid this problem, referring to FIG. 3, there is the possibility of implementing the low-pass filter 50 as a digital filter, for example using a signal processor, to which the sensor signal 10 is fed. Said filter may be realized as an FIR filter or IIR filter and once again has the same transfer function as the thermal transfer path or the electrical equivalent circuit diagram of the thermal transfer path of the semiconductor component between hot spot 20 and temperature sensor 10.

FIR filters are distinguished by the fact that they have a finite impulse response and operate in discrete time steps that are usually determined by the sampling frequency of an analog signal. In this case, an FIR filter of order N is described by the differential equation:

$$y[n] = b_0 * x[n] + b_1 * x[n-1] + b_2 * \tag{5}$$
$$x[n-2] + \ldots + b_N * x[n-N]$$
$$= \sum_{i=0}^{N} b_i * x[n-i]$$

where y[n] is the output value at the instant n and is calculated from the sum of the N last sampled input values x[n−N] to x[n], which sum is weighted with the filter coefficients $b_i$. The desired transfer function is realized by the definition of the filter coefficients $b_i$ in this case.

In the case of IIR filters, in contrast to FIR filters, already calculated output values are also included in the calculation (recursive filter) and are distinguished by the fact that they have an infinite impulse response. Since the calculated values are very small after a finite time, however, the calculation can in practice be terminated after a finite number of samples n. The calculation specification for an IIR filter reads:

$$y[n] = \sum_{i=0}^{N} b_i * x[n-i] - \sum_{i=0}^{M} a_i * y[n-i] \tag{6}$$

where y[n] is the output value at the instant n and is calculated from the sum of the sampled input values x[n] weighted with the filter coefficients $b_i$ added to the sum of the output values y[n] weighted with the filter coefficients $a_i$. The desired transfer function is once again realized by the definition of the filter coefficients $a_i$ and $b_i$ in this case.

IIR filters, in contrast to FIR filters, may be unstable, but have a higher selectivity with the same outlay for the realization. In practice, that filter is chosen which best meets the required conditions taking account of the requirements and the associated computational complexity. It is evident that these digital filters can be used also to realize filter characteristics other than those of the low-pass filter described, if this is necessary for the mapping of the transfer function of the thermal transfer path between hot spot HS and temperature sensor TS.

FIG. 4 shows the results of a simulation of the component arrangements in accordance with FIGS. 2 and 3 assuming a greatly transient profile of the temperature at the hot spot 20 of the semiconductor element. All the signals are plotted linearly against the time t.

Figure 4A:
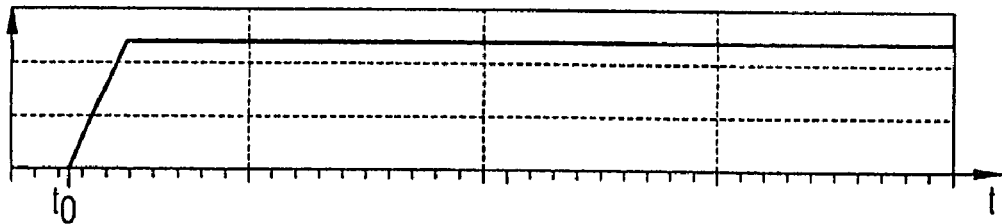
FIG. 4 shows temporal profiles of selected signals occurring in the component arrangements according to FIGS. 2 and 3, which profiles were obtained on the basis of simulations.

FIG. 4A illustrates the input voltage V31 of the electrical equivalent circuit diagram of the thermal transfer path of the semiconductor component between hot spot 20 and temperature sensor 10, which represents a measure of an assumed change in the temperature at the hot spot 20 of the semiconductor component. In the example, said voltage V31 rises rapidly, starting from an instant t0, from a lower value to an upper value. In this case, the lower value may correspond to a temperature of the hot spot 20 when the semiconductor component is switched off, that is to say if no heat-generating power loss occurs and the temperatures at the hot spot 20 and at the temperature sensor 10 are equal to the ambient temperature of the semiconductor component. The upper value may correspond for example to a peak temperature of the hot spot 20 achieved in the steady-state temperature state, such as is achieved when the semiconductor component is switched on.

Figure 4B:
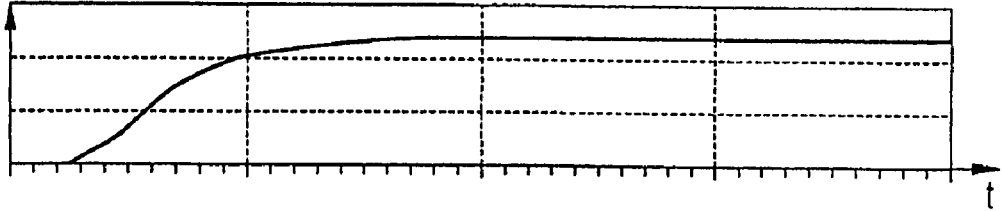

FIG. 4B shows the profile—associated with the profile of the voltage V31—of the output voltage V10 of the temperature sensor 10 as a reaction to the temperature profile at the hot spot HS of the semi-conductor element. It is possible clearly to discern the retarded signal rise of said sensor voltage V10 in comparison with the voltage V31, said retarded signal rise being brought about by the low-pass filter effect of the thermal transfer path between hot spot 20 and spatially remote temperature sensor 10. This delayed rise in the sensor signal caused by the thermal transfer response on the way from the hot spot 20 to the location of the temperature sensor 10 does not permit a temperature rise above a predefined limit at the hot spot 20 to be identified in good time, with the result that countermeasures, such as, for example, turning off in good time the semiconductor component or a load operated by means of the latter, cannot be initiated in good time.

Figure 4C:
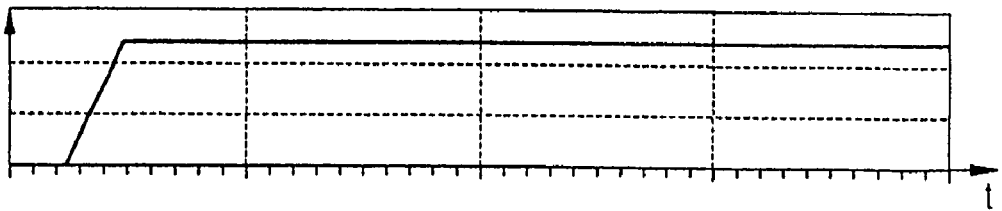

FIG. 4C shows the profile of the input voltage V51, V40 of the low-pass filter 50 of the control arrangement. This temporal profile, due to the adaptation of the transfer response of the low-pass filter 50 to the transfer response of the thermal.

transfer path or the transfer response of the electrical equivalent model of said transfer path, corresponds to the temporal profile of the input signal V31 of the equivalent model, and hence to the temporal profile of the hot spot temperature. Said voltage V51, V40 is in real time a measure of temperature changes at the hot spot 20 and can therefore not only be used for the timely reaction to the occurrence of undesirable operating states, for example by turning off the semi-conductor component or a load operated by means of the latter, but also can be used for the general analysis of the dynamic temperature response at the hot spot of a semiconductor component.

The invention claimed is:

1. A component arrangement comprising:
a semiconductor component having a semiconductor body; and
a temperature measuring arrangement configured to determine a temperature at a predefined position in the semiconductor body, the temperature measuring arrangement comprising,
a temperature sensor integrated in the semiconductor body, said temperature sensor configured to generate a first temperature signal dependent on a temperature in the semiconductor body,
a control device comprising a control amplifier including a first and a second input and an output, the control device further comprising a low-pass filter including an input and an output, the input of the low-pass filter coupled to the output of the control amplifier, the first input of the control amplifier coupled to the temperature sensor and the second input of the control amplifier coupled to the output of the low-pass filter, and
an output coupled to the output of the control amplifier, wherein the temperature measuring arrangement is configured to provide a second temperature signal at the output.

2. The component arrangement as claimed in claim 1, wherein a thermal transfer path between the predefined position in the semiconductor body and a position of the temperature sensor has a thermal transfer function with a low-pass filter behavior and in which the low-pass filter has a behavior corresponding to the low-pass filter behavior of the thermal transfer path.

3. The component arrangement as claimed in claim 1, wherein the temperature measuring arrangement is integrated in the semiconductor body.

4. The component arrangement as claimed in claim 1, wherein the control amplifier is an operational amplifier.

5. The component arrangement as claimed in claim 1, wherein the low-pass filter is an FIR filter.

6. The component arrangement as claimed in claims 1, wherein the low-pass filter is an IIR filter.

7. A method for determining the temperature at a predefined position in a semiconductor body, the method comprising:

determining a first temperature at a first position at a distance from the predefined position;
providing a first temperature signal dependent on said first temperature;
determining a thermal transfer function between the predefined position and the first position;
providing a filter for an electrical input signal, the filter having a transfer function corresponding to the thermal transfer function; and
feeding a control signal into the filter, the control signal dependent on a comparison of the first temperature signal with an output signal of the filter, and
providing said control signal or a signal dependent on said control signal as a temperature signal dependent on the temperature at the predefined position.

8. The method as claimed in claim 7, wherein the filter is a low-pass filter.

9. The method as claimed in claim 8, wherein the control signal is dependent on a difference between the first temperature signal and the output signal of the low-pass filter.

10. The method as claimed in claim 8, wherein the low-pass filter is an FIR filter.

11. The method as claimed in claim 8, wherein the low-pass filter is an FIR filter.

12. A component arrangement for determining the temperature at a predefined position in a semiconductor body, the arrangement comprising:
means for determining a first temperature at a first position a distance from the predefined position and providing a first temperature signal dependent on said first temperature;
means for filtering an input signal and providing an output signal, the means for filtering defining a transfer function corresponding to a thermal transfer function between the predefined position and the first position; and
a comparator configured to compare the first temperature signal with the output signal of the means for filtering and provide the input signal to the means for filtering, wherein the input signal is a signal dependent on the temperature at the predefined position.

13. The component arrangement as claimed in claim 12, wherein the means for determining the first temperature is integrated in the semiconductor body.

14. The component arrangement as claimed in claim 12 wherein the comparator comprises an operational amplifier.

15. The component arrangement as claimed in claim 12, wherein the means for filtering comprises a low-pass filter.

16. The component arrangement as claimed in claim 15, wherein the low-pass filter is an FIR filter.

17. The component arrangement as claimed in claims 15, wherein the low-pass filter is an IIR filter.

* * * * *